(12) United States Patent
Kadri et al.

(10) Patent No.: US 12,531,559 B2
(45) Date of Patent: Jan. 20, 2026

(54) PROGRAMMABLE LOGIC DEVICES WITH MULTI-LEVEL INPUT/OUTPUT SIGNALS

(71) Applicant: Hewlett Packard Enterprise Development LP, Spring, TX (US)

(72) Inventors: Rachid Kadri, Houston, TX (US); Michael Chan, Bellaire, TX (US)

(73) Assignee: Hewlett Packard Enterprise Development LP, Spring, TX (US)

(*) Notice: Subject to any disclaimer, the term of this patent is extended or adjusted under 35 U.S.C. 154(b) by 406 days.

(21) Appl. No.: 18/140,359

(22) Filed: Apr. 27, 2023

(65) Prior Publication Data

US 2024/0364344 A1    Oct. 31, 2024

(51) Int. Cl.
  *H03K 19/173*    (2006.01)
  *H03K 19/20*    (2006.01)
  *H03M 1/78*    (2006.01)

(52) U.S. Cl.
  CPC ........... *H03K 19/173* (2013.01); *H03K 19/20* (2013.01); *H03M 1/785* (2013.01)

(58) Field of Classification Search
  None
  See application file for complete search history.

(56) References Cited

U.S. PATENT DOCUMENTS

| | | | |
|---|---|---|---|
| 6,735,706 B2 | 5/2004 | Tomlinson et al. | |
| 6,765,408 B2 | 7/2004 | Cheng et al. | |
| 6,864,710 B1 | 3/2005 | Lacey et al. | |
| 7,111,183 B1 | 9/2006 | Klein et al. | |
| 8,101,902 B2 | 1/2012 | Baumann | |
| 10,331,593 B2 | 6/2019 | Lambert et al. | |
| 10,547,313 B2 | 1/2020 | Auer et al. | |
| 2002/0010821 A1 | 1/2002 | Yu et al. | |
| 2005/0030114 A1* | 2/2005 | Starr | H03L 7/1803 331/78 |
| 2009/0006659 A1 | 1/2009 | Collins et al. | |

FOREIGN PATENT DOCUMENTS

WO    2009/005609 A1    1/2009

OTHER PUBLICATIONS

Ma et al., "An FPGA-based Multi-level All-Digital Transmitter with 1.25 GHz of Bandwidth", Mitsubishi Electric Research Laboratories, Inc., 2018, 6 pages.

* cited by examiner

*Primary Examiner* — Jany Richardson
(74) *Attorney, Agent, or Firm* — Yao Legal Services, Inc.

(57) ABSTRACT

One aspect provides a programmable logic device. The device includes an input circuit for detecting a multi-level input signal and an output circuit. The input circuit includes: an input pin for receiving the multi-level input signal; first and second programmable voltage generators to generate, respectively, first and second multi-level voltage signals; a pair of comparators, each comparator having a first input coupled to the input pin and a second input coupled to a corresponding programmable voltage generator; and a logic gate coupled to the comparators, thereby facilitating the detection of the multi-level input signal based on outputs of the comparators. The output circuit includes a third programmable voltage generator to generate a third multi-level voltage signal, an output pin, and a voltage buffer coupling the third programmable voltage generator to the output pin, thereby facilitating the programmable logic device to output, over the output pin, the third multi-level voltage signal.

19 Claims, 9 Drawing Sheets

PROGRAMMABLE LOGIC DEVICES WITH MULTI-LEVEL INPUT/OUTPUT SIGNALS

BACKGROUND

Field

This disclosure is generally related to the design of programmable logic devices (PLDs). More specifically, this disclosure is related to the input and output design of the PLDs.

BRIEF DESCRIPTION OF THE FIGURES

In the figures, like reference numerals refer to the same figure elements.

DETAILED DESCRIPTION

A programmable logic device (PLD) is a type of electronic device that can be programmed by a user to perform various logical functions. They can be used to create custom logic circuits without the need for specialized hardware. Compared to traditional hardware-based logic circuits, PLDs can provide a number of advantages, including flexibility, reusability, and cost-effectiveness.

As circuit designers demand higher performance and more complex designs of programmable logic devices (PLDs), the number of signals handled by a PLD continues to increase, which can require a greater number of input/output pins and consequently an increased device size. To reduce the number of input/output pins, according to some aspects, a PLD can implement multi-level signaling, where the input and/or output signals of the PLD are no longer binary. However, generating multi-level signals in a conventional PLD can be challenging because the output voltage of a PLD bank is determined by the power rail of that bank.

Conventional PLDs transmit and receive binary signals with fixed voltage levels. A PLD may have a plurality of PLD banks powered by power rails providing direct current (DC) voltages of different levels. The output of a PLD bank would be fixed to the DC voltage of the particular power rail providing power to the PLD bank. Converting the fix-level PLD output to a different voltage can require configuring the PLD output as Open Drain (OD) and coupling the OD output to a different power rail on the system board. Because typically there is a limited number of voltage levels provided by the power rails on the system board, the available PLD output voltage levels are limited.

According to some aspects of the instant application, the above problem can be solved by modifying the input and output circuits of the PLD to allow the PLD to receive and transmit arbitrary multi-level signals. More specifically, the conventional output buffer of the PLD can be replaced by an operational amplifier (opamp) coupled to a programmable voltage generator capable of generating voltages of multiple levels, and the input buffer of the PLD can be modified to include a pair of input comparators each coupled to a programmable voltage generator to facilitate the detection of received multi-level voltage signals. The programmable voltage generator can include a control logic that outputs a number of bits and a digital-to-analog converter (DAC) that can convert the output bits to a voltage corresponding to the bit values.

Figure 1:
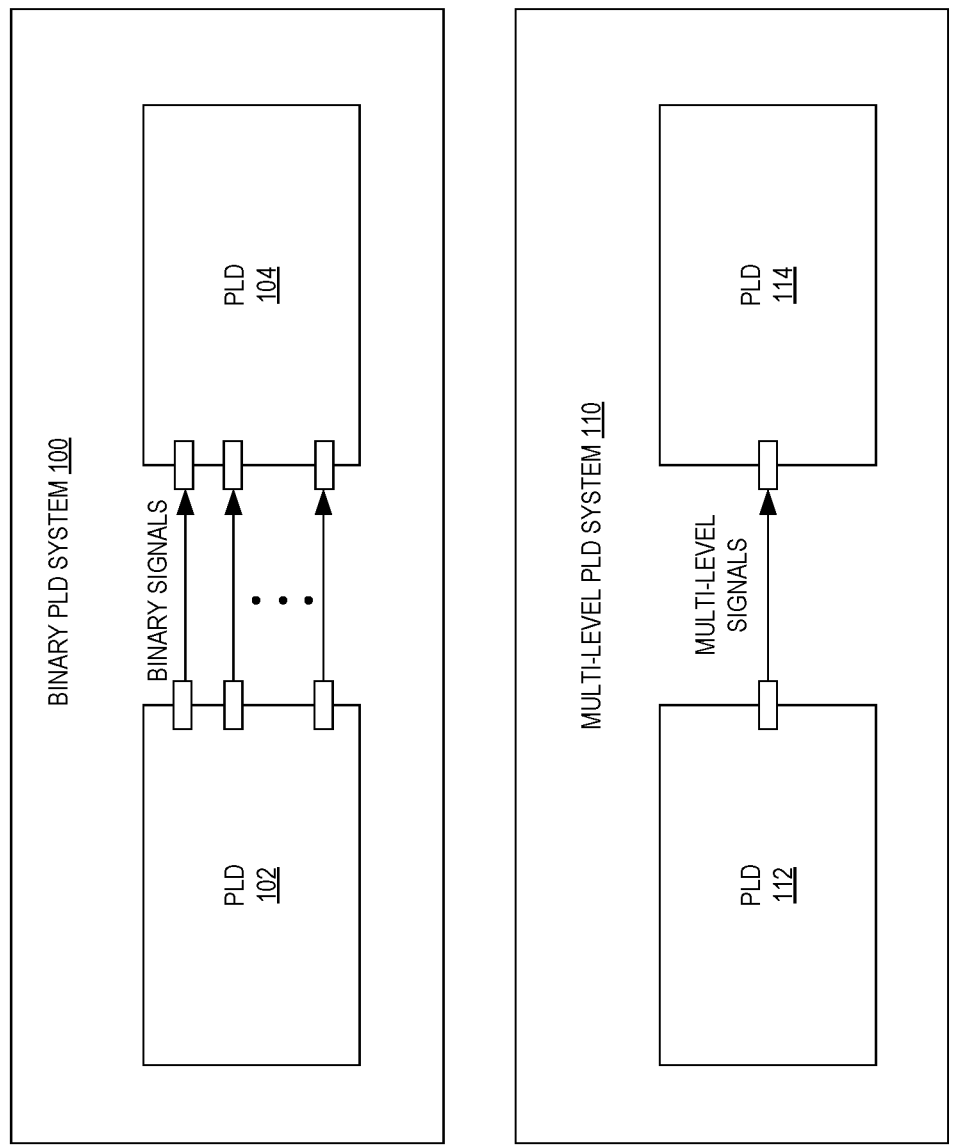
FIG. 1 illustrates implementation examples of programmable logic devices (PLDs), according to one aspect of the instant application.

FIG. 1 illustrates implementation examples of programmable logic devices (PLDs), according to one aspect of the instant application. The top drawing of FIG. 1 shows a binary PLD system 100, and the bottom drawing of FIG. 1 shows a multi-level PLD system 110.

Binary PLD system 100 can include PLDs 102 and 104, each implementing binary signaling, meaning that each PLD inputs and outputs binary signals. As discussed previously, the voltage level of each output is fixed and depends on the power rail providing power to the PLD bank generating the output. In this example, PLD 102 includes a plurality of output pins that are respectively coupled to a plurality of input pins of PLD 104. Given each output being binary, the information provided by the plurality of output pins can be represented using a sequence of binary bits. For example, if PLD 102 includes three output pins, the output information can be represented using a binary sequence $b_2b_1b_0$. A longer bit sequence would require more output pins on PLD 102.

Multi-level PLD system 110 can include PLDs 112 and 114, each implementing multi-level signaling, meaning that each PLD inputs and outputs multi-level signals. Compared to binary signals having only two possible voltage levels, a multi-level signal can have more than two (e.g., four, eight, sixteen, etc.) possible voltage levels. In this example, PLD 112 includes a single output pin coupled to an input pin of PLD 114. Compared to a binary output pin carrying binary signals, the multi-level output pin carrying multi-level signals can convey much richer information. Depending on the number of possible voltage levels of the output signal, information provided by the single output pin pf PLD 112 can be represented using a number of binary bits. For example, if the output signal has eight possible voltage levels, the output information can be represented using a binary sequence $b_2b_1b_0$. A longer bit sequence would require the output signal to have more possible voltage levels.

As can be seen from FIG. 1, compared to binary PLD system 100, multi-level PLD system 110 requires fewer input/output pins to convey the same amount of information. The reduced pin number can decrease the size and complexity of the PLDs. One approach to adjusting the voltage level of an output signal relies on an external power source (e.g., a different power rail on the system board). However, with this approach, the number of possible voltage levels is limited by the number of external power sources. Moreover, this approach requires that the PLD output be configured as OD and uses a pull-up resistor connected to the power rail to produce a high output voltage. In situations where the function of the output signal needs to be more flexible, the OD configuration may not be desirable. According to some aspects of the instant application, the PLD output buffer for each output pin can be redesigned to improve the capability of the PLD in dealing with multi-level signals. More specifically, the output buffer can include an operational amplifier (opamp) capable of varying its output voltage level in discrete steps. The opamp can be coupled to a programmable voltage generator that can determine the output voltage level of the opamp.

Figure 2:
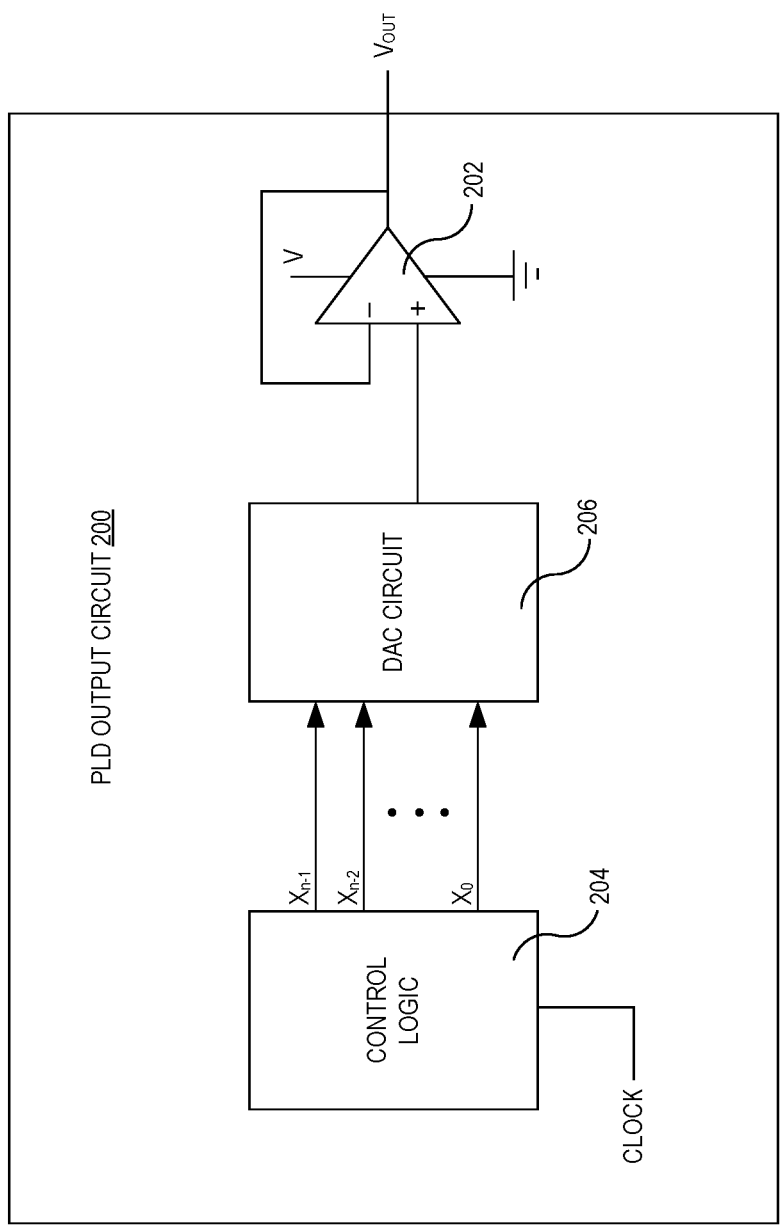
FIG. 2 illustrates an example of an output circuit of a PLD, according to one aspect of the instant application.

FIG. 2 illustrates an example of an output circuit of a PLD, according to one aspect of the instant application. In FIG. 2, a PLD output circuit 200 can include an opamp 202, a control logic 204, and a digital-to-analog converter (DAC) circuit 206.

Control logic 204 can include a number of binary outputs (e.g., $X_{n-1}, X_{n-2} \ldots, X_0$) coupled to the input of DAC circuit 206. DAC circuit 206 can convert the binary outputs of control logic 204 to an analog signal (i.e., a voltage signal). The voltage level of the analog signal can depend on a reference voltage and the binary bit sequence $X_{n-1}X_{n-2} \ldots X_0$. The output of DAC circuit 206 can be coupled to the non-inverting input of opamp 202, which is configured as a unity gain buffer with its output directly coupled to its inverting input. Consequently, the output of the PLD (i.e., $V_{out}$) equals the output of DAC circuit 206. This way, the output voltage level of the PLD corresponds to the value of the binary bit sequence outputted by control logic 204 (i.e., $X_{n-1}X_{n-2} \ldots X_0$) and a reference voltage. PLD output circuit 200 can also be referred to as a programmable voltage generator because it can generate a voltage signal based on a programmable binary sequence (e.g., $X_{n-1}X_{n-2} \ldots X_0$).

Control logic 204 can be implemented using logic gates that are already in the PLD and can receive control signals from a remote controller to set the values of its binary outputs. Depending on the application, control logic 204 can generate a static binary sequence or a time-varying binary sequence. DAC circuit 206 can be implemented using various DAC technologies, including but not limited to: pulse-width modulation, interpolation, binary summation, successive approximation, etc. According to one aspect, DAC circuit 206 can implement an R-2R resistor ladder network that uses a repeating cascaded structure of resistors with values R and 2R. Considering that components for forming the resistor ladder network already exist in PLDs, this solution is straightforward to implement and cost-effective.

Figure 3A:
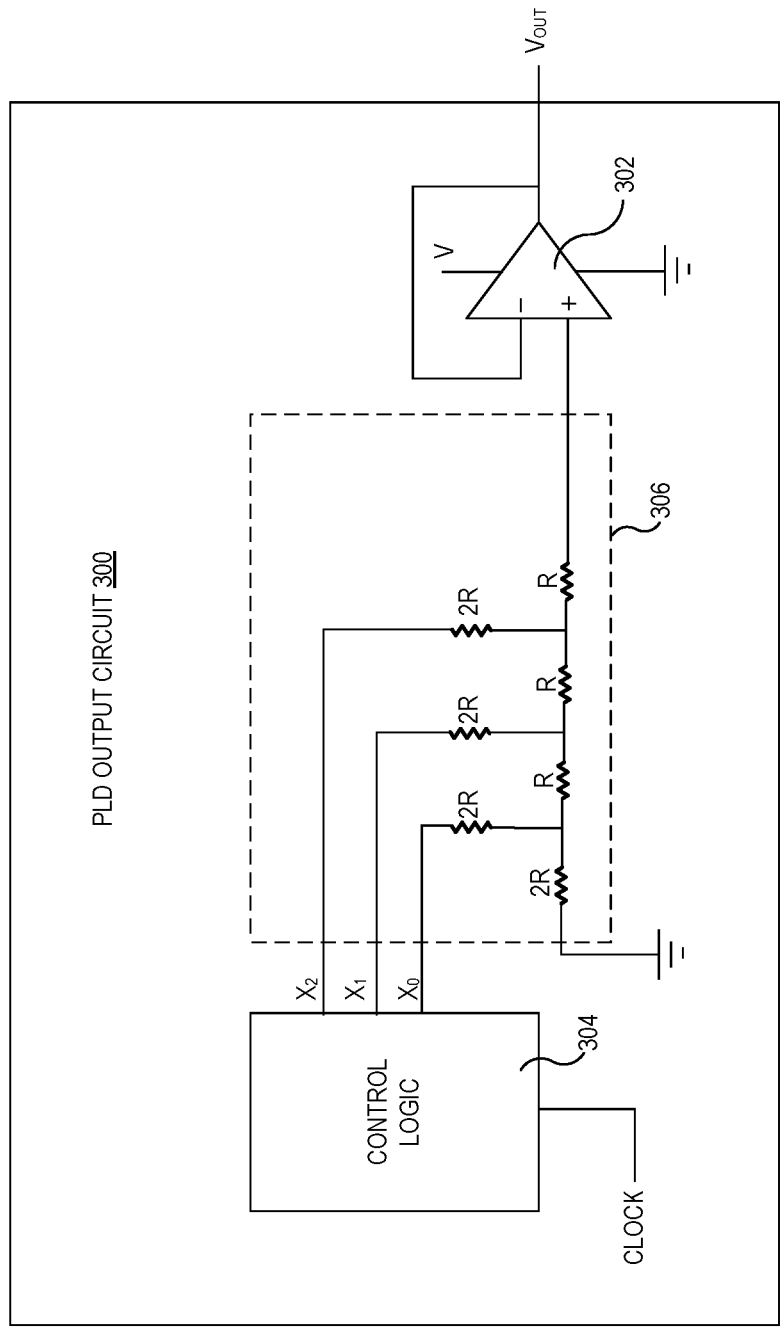
FIG. 3A illustrates an example of a PLD output circuit with an R-2R resistor ladder network, according to one aspect of the instant application.

FIG. 3A illustrates an example of a PLD output circuit with an R-2R resistor ladder network, according to one aspect of the instant application. In FIG. 3A, a PLD output circuit 300 can include an opamp 302, a control logic 304, and a three-bit R-2R resistor ladder network 306.

Opamp 302 can be similar to opamp 202 shown in FIG. 2 and can be configured as a unity gain buffer. Control logic 304 can be similar to control logic 204 shown in FIG. 2. In this example, control logic 304 can have three binary outputs (i.e., $X_2$, $X_1$, and $X_0$). The three binary outputs can be coupled to the corresponding bits of three-bit R-2R resistor ladder network 306. In this example, $X_2$ is coupled to the most significant bit, and $X_0$ is coupled to the least significant bit. Note that each binary output of control logic 304 can be switched between V=0 (logic "0") and $V=V_{ref}$ (logic "1"). R-2R resistor ladder network 306 causes these digital bits to be weighted in their contribution to the output voltage $V_{out}$. Depending on the values of the bits, the output voltage ($V_{out}$) of circuit 300 will have a corresponding stepped value between 0 and $V_{ref}$. The number of discrete voltage levels of the output voltage depends on the number of output bits of control logic 304. If control logic 304 can output n binary bits, the output voltage can have $2^n$ possible levels. The resistor values can be chosen based on the practical need. According to one aspect, R=10 KΩ.

Figure 3B:
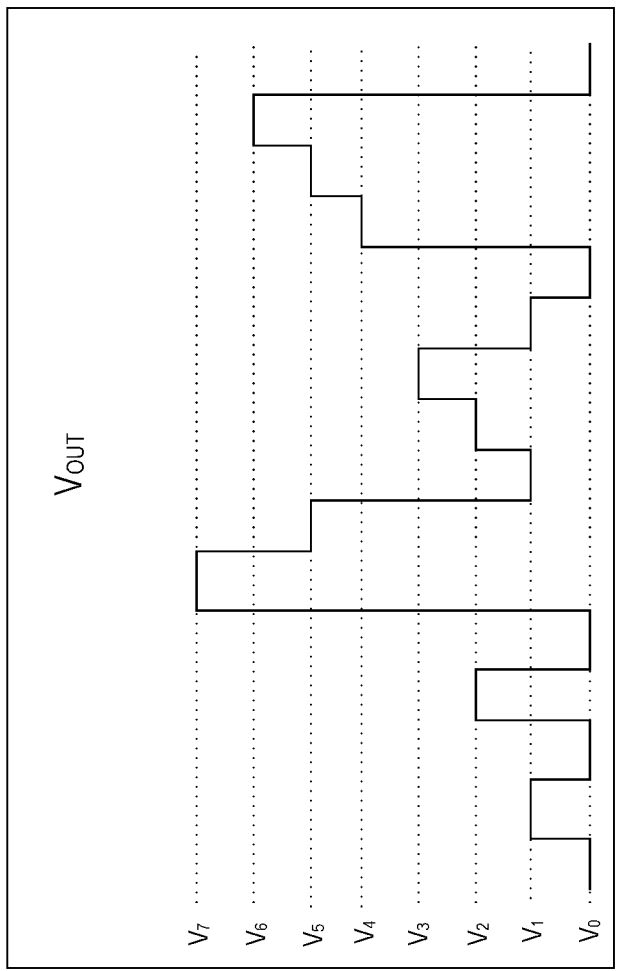
FIG. 3B illustrates examples of output voltages of a PLD output circuit, according to one aspect of the instant application.

FIG. 3B illustrates examples of output voltages of PLD output circuit 300, according to one aspect of the instant application. In this example, the reference voltage can be 3.3V, which is the typical CMOS logic "1" voltage. The left drawing of FIG. 3B shows the eight possible output bit sequences of control logic 304 and the eight corresponding voltage levels. As can be seen in FIG. 3B, the step between two consecutive levels is 0.471 V (i.e., 3.3 V/7). This step is also referred to as the resolution of the multi-level signal. A relatively large step or resolution can ensure that the multi-level signal can be correctly evaluated or recognized at the receiving end using relatively low-cost components.

The right drawing of FIG. 3B shows an example of a pulse train outputted by PLD output circuit 300. As can be seen from FIG. 3B, the output voltage can have multiple levels, ranging from $V_0$=0V to $V_7$=3.297V. Compared to conventional binary pulse trains, this multi-level pulse train can carry more information. For example, each pulse in FIG. 3B can correspond to three binary bits (i.e., $X_2$, $X_1$, and $X_0$). In situations where binary logic is used, instead of using three output pins to send out three separate signals, the system can use a common pin to output signals of eight different levels. At the receiving end, the input circuit (which can include comparators and opamps) of the PLD can recover the binary bits by detecting the voltage level of the multi-level signal. Because modern PLDs often include comparators and opamps, the solution for detecting the multi-level signals can leverage these already available comparators and opamps without additional cost.

Figure 4:
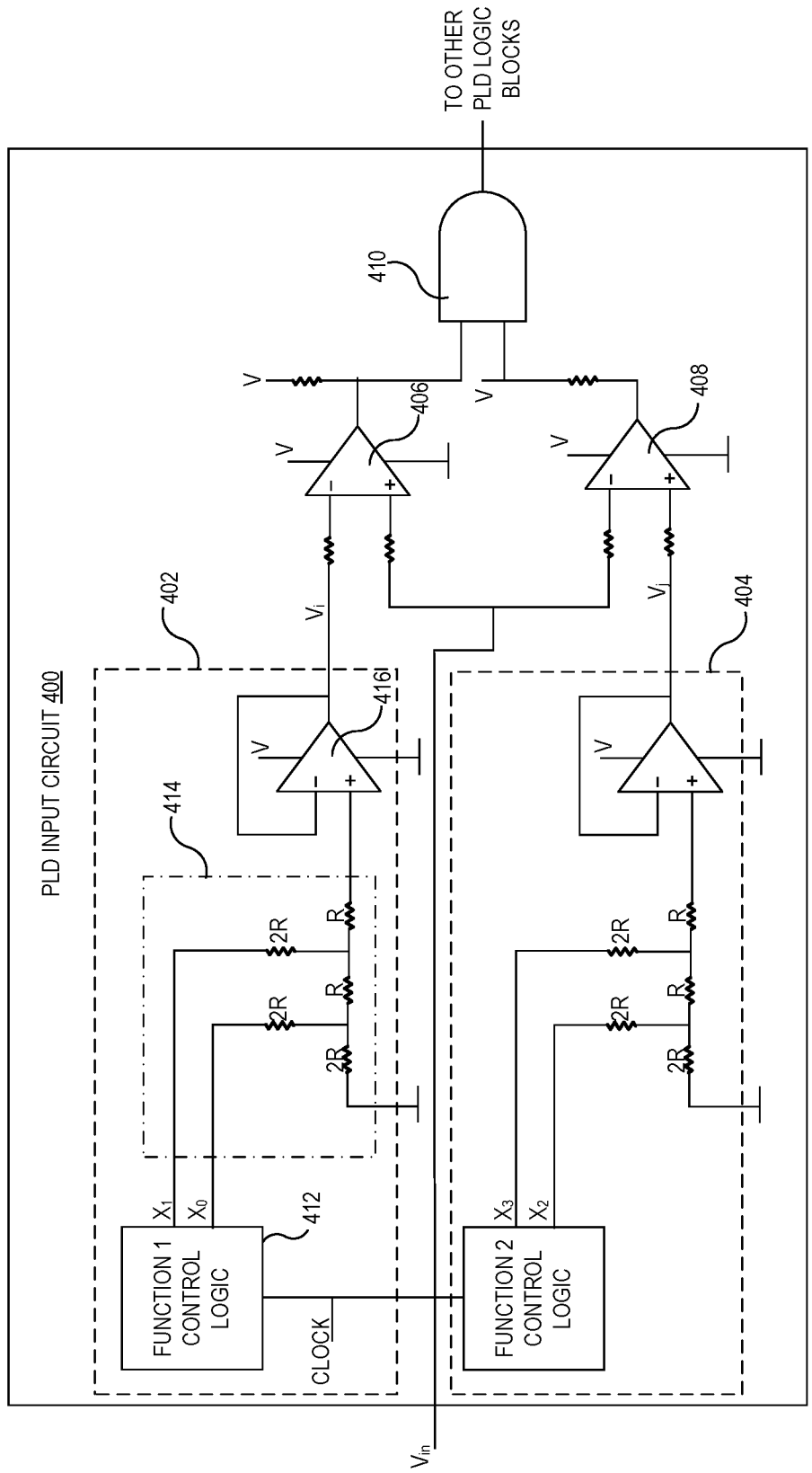
FIG. 4 illustrates an example of an input circuit of a PLD, according to one aspect of the instant application.

FIG. 4 illustrates an example of an input circuit of a PLD, according to one aspect of the instant application. PLD input circuit 400 can include a pair of programmable voltage generators 402 and 404, a pair of comparators 406 and 408, and a logic gate 410.

Each programmable voltage generator can be similar to output circuit 200 shown in FIG. 2 and can include a control logic, a DAC circuit, and an opamp-based buffer. For example, programmable voltage generator 402 can include a control logic 412, a DAC circuit 414, and an opamp-based buffer 416.

In the example shown in FIG. 4, each control logic (e.g., control logic 412) can include two binary outputs. In practice, the number of binary outputs of the control logic can be more than two. Control logic 412 in programmable voltage generator 402 outputs bits $X_1$ and $X_0$, and the control logic in programmable voltage generator 404 outputs bits $X_3$ and $X_2$. The DAC circuit (e.g., circuit 414) in each programmable voltage generator can implement an R-2R resistor ladder network. According to one aspect, the R-2R resistor ladder network can include two cascaded stages, and R=10 KΩ. As discussed previously, the output of each programmable voltage generator can be determined by a reference voltage and the binary bits generated by the corresponding control logic. For example, the output voltage of programmable voltage generator 402 (i.e., $V_i$) can be determined by the reference voltage and binary bits $X_1$ and $X_0$, and the output voltage of programmable voltage generator 404 (i.e., $V_j$) can be determined by the reference voltage and binary bits $X_3$ and $X_2$. By carefully selecting the values of the binary bits, one can determine the appropriate voltage values for $V_i$ and $V_j$. In this example, values of bits $X_0$-$X_3$ are selected such that $V_i<V_j$.

The input pin (which can receive a to-be-detected input voltage signal $V_{in}$) and the output of a programmable voltage generator can be sent to a corresponding comparator (e.g., a differential-amplifier-based comparator). For example, the input voltage signal $V_{in}$ can be sent to the positive input of comparator 406, and the output of programmable voltage generator 402 (i.e., $V_i$) can be sent to the negative input of comparator 406. Accordingly, comparator 406 can output a logic "1" if $V_{in}>V_i$ and a logic "0" if $V_{in}<V_i$. On the other hand, the output of programmable voltage generator 404 (i.e., $V_j$) can be sent to the positive input of comparator 408, and the input voltage signal $V_{in}$ can be sent to the negative input of comparator 406. Accordingly, comparator 408 can output a logic "1" if $V_j>V_{in}$ and a logic "0" if $V_j<V_{in}$. In other words, the input voltage signal $V_{in}$ is compared, separately, with the two voltages generated by programmable voltage generators 402 and 404. The output of each comparator can then be sent to logic gate 410, which can be an AND gate. If and only if both comparators output a logic "1," AND gate 410 can output a logic "1;" otherwise, AND gate 410 can output a logic "0." This way, PLD input circuit 400 can detect whether the input voltage signal $V_{in}$ is within the predetermined voltage range (e.g., between $V_i$ and $V_j$). If so, PLD input circuit 400 can output a logic "1;" otherwise, PLD input circuit 400 can output a logic "0." The output of PLD input circuit 400 can then be sent to other related PLD logic blocks, which can use this detection result to perform intended logic operations.

In the example shown in FIG. 4, the outputs of the comparators are sent to an AND gate. In practice, depending on the circuit configuration (e.g., which signal is sent to which input of each comparator), other types of logic gates can also be used. In an alternative example, the input voltage signal $V_{in}$ can be sent to the negative input of comparator 406 and the positive input of comparator 408, and the outputs of comparators 406 and 408 can be sent to an OR gate. Other configurations are also possible, as long as the result of the comparisons (e.g., whether the input voltage is within a predetermined voltage range) can generate a unique response (which can be a logic "1" or "0") at the output of PLD input circuit 400.

PLD input circuit 400 can be used to detect the multi-level voltage signals outputted by, for example, PLD output circuit 300 shown in FIG. 3A. More specifically, by configuring the control logic in each programmable voltage generator, PLD input circuit 400 can detect multi-level voltage signals within a particular voltage range. Using the eight possible signal levels shown in FIG. 3B as an example, to detect a voltage signal between $V_2$ (0.942 V) and $V_3$ (1.413 V), one can program control logic 412 such that the output of programmable voltage generator 402 (i.e., $V_i$) is 0.942 V and program the control logic within programmable voltage generator 404 such that its output (i.e., $V_j$) is 1.413 V. If the input voltage signal $V_{in}$ is within the range between 0.942 V and 1.413 V, PLD input circuit 400 can output a logic "1;" otherwise, PLD input circuit 400 can output logic "0."

Note that given the programmed bit values at each control logic, the PLD input circuit can only detect or respond to signals within the corresponding range. If signals outside of the range need to be detected, the control logic needs to be reprogrammed such that the programmable voltage generator can generate a different voltage output. For example, to detect input signals between $V_1$ (0.471 V) and $V_2$ (0.942 V), the control logic in each programmable voltage generator can be reprogrammed such that $V_i$=0.471 V and $V_j$=0.942 V. Other ranges can also be possible. In one example, to detect a voltage level V, $V_i$ and $V_j$ can be set as V−δV and V+δV, with δV being a predetermined voltage value.

Because the voltage difference between the inputs of each comparator can be relatively large (e.g., a few hundred mV or greater), comparators 406 and 408 as well as the opamp in each programmable voltage generator (e.g., opamp 416) can be implemented using low-cost components that are widely used in current PLDs. Therefore, the manufacturing cost of the novel PLDs with multi-level input/output signals can be comparable to traditional PLDs with binary input/output signals.

According to some aspects, to ensure that the multi-level signals can be correctly detected, the initiator PLD (i.e., the PLD transmitting the multi-level signals) and the target PLD (i.e., the PLD receiving the multi-level signals) should be fed with clock signals of the same frequency. In the examples shown in FIG. 3A and FIG. 4, the clock signal sent to control logic 304 within PLD output circuit 300 and the clock signal sent to the control logic in each programmable voltage generator should have the same frequency. In addition, the clock signals should be chosen in a way such that the delay (which can be caused by the comparators and logic blocks in the target PLD) can be met using the same principles of logic design for meeting the setup/hold time. Note that such technology is widely used in modern computer design. For example, it is common to have a simple interface (e.g., an input/output serial data bus) to send a clock generated by the initiator PLD to the target PLD.

Figure 5:
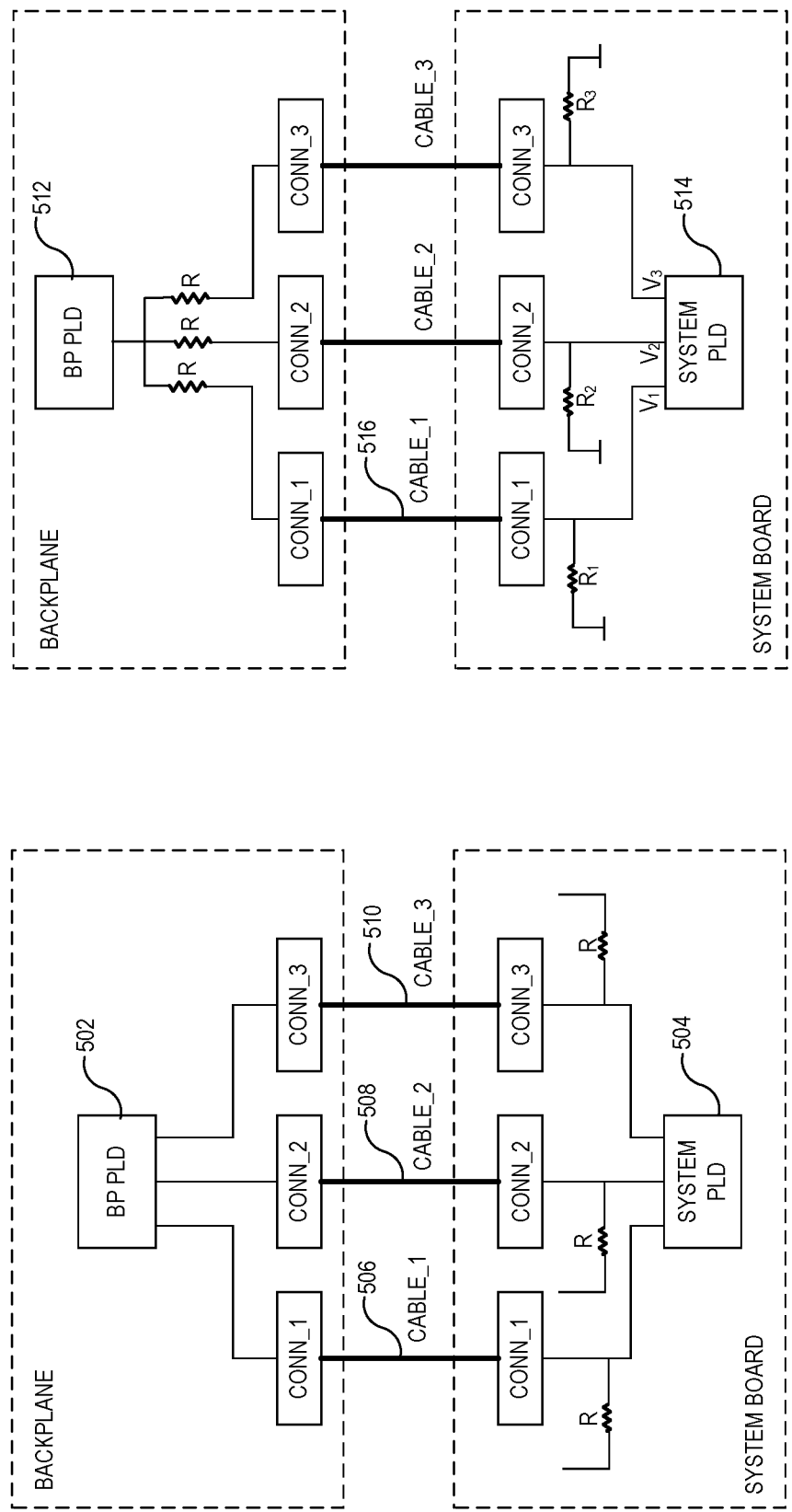
FIG. 5 illustrates an application example for reducing the input/output pins of a PLD, according to one aspect of the instant application.

The ability for transmitting and receiving multi-level signals has provided the novel PLDs with many advantages, including increased flexibility and capacity. In one application, the multi-level signals can convey more information than binary signals, thus making it possible to reduce the number of input/output pins on a PLD. FIG. 5 illustrates an application example for reducing the input/output pins of a PLD, according to one aspect of the instant application. The left drawing shows a scenario where a backplane (BP) PLD 502 and a system PLD 504 use binary signals to determine the cable connection status. In the example shown in FIG. 5, a number of connectors on the backplane can be connected to a number of connectors on the system board via a number of cables (e.g., cables 506, 508, and 510). To determine the connection status of each cable, the system board can implement a cable-status signal that is pulled high (e.g., by a pull-up resistor) when the cable is not plugged in. BP PLD 502 needs to send three binary signals (via three separate output pins), and system PLD 504 can separately determine (based on the voltage level detected at each input pin) whether a particular cable has been plugged in. This solution requires that BP PLD 502 and system PLD 504 each have three cable-status pins, one pin per cable. As the number of cables increases, so is the number of pins, which can cause an increase in the size of the PLDs.

The right drawing of FIG. 5 shows a scenario where a BP PLD 512 and a system PLD 514 use multi-level signals to determine the cable connection status. Instead of having three separate output pins, BP PLD 512 can use a single pin to output a common signal to system PLD 514. On the system board, each cable-status pin of system PLD 514 can be coupled to a pull-down resistor of a unique value (e.g., $R_1$, $R_2$, or $R_3$). The different pull-down resistors can cause the voltage levels at the three cable-status pins on system PLD 514 to have different values (e.g., $V_1$, $V_2$, or $V_3$). At each input pin, system PLD 514 can have an input circuit similar to PLD input circuit 400 shown in FIG. 4 to allow the detection of the voltage signal in a particular range. Therefore, by detecting the unique voltage level at each cable-status pin, system PLD 514 can determine the connection status of each cable. For example, if cable 516 is not connected properly, a different voltage other than $V_1$ may be present at the corresponding input pin of system PLD 514. The input pin corresponding to cable 516 has been configured to detect $V_1$ (e.g., the programmable voltage generators have been programmed to generate appropriate voltages), and if it determines that the input is not $V_1$, it can flag that cable 516 is not connected properly. The input circuits of the other two cable-status pins are not programmed to respond to $V_1$. A similar detection process can be used to detect the connection status of the other two cables.

As can be seen from FIG. 5, the number of cable-status pins on the backplane PLD can be reduced when the system PLD is capable of detecting multi-level signals (or non-binary signals).

In addition to conveying more information compared to binary signals, multi-level signals can also be used to simplify the receiver logic by routing the same multi-level signal to multiple PLD components or devices without the need for address decoding logic. In conventional approaches, when an initiator PLD needs to send signals to multiple destinations (e.g., multiple target PLDs or multiple functions blocks in the same target PLD) via the same bus, each signal needs to carry address information that can be decoded at the destination such that only the intended receiver will receive the signal. This requires an address-decoding logic at the target PLD, thus increasing the complexity of the receiver logic. With multi-level signaling, there is no need for the address-decoding logic at the receiver. More specifically, the input circuit of different components or devices can be configured to detect voltage signals within different ranges, and the initiator PLD can program its control logic within its output circuit such that it outputs signals of different voltage levels when sending signals to different destinations. This way, if a destination component receives a detectable signal (i.e., a signal within the detectable voltage range), the destination component can determine that it is the intended receiver; otherwise, the destination component is not the intended receiver and can ignore the received signal.

Figure 6:
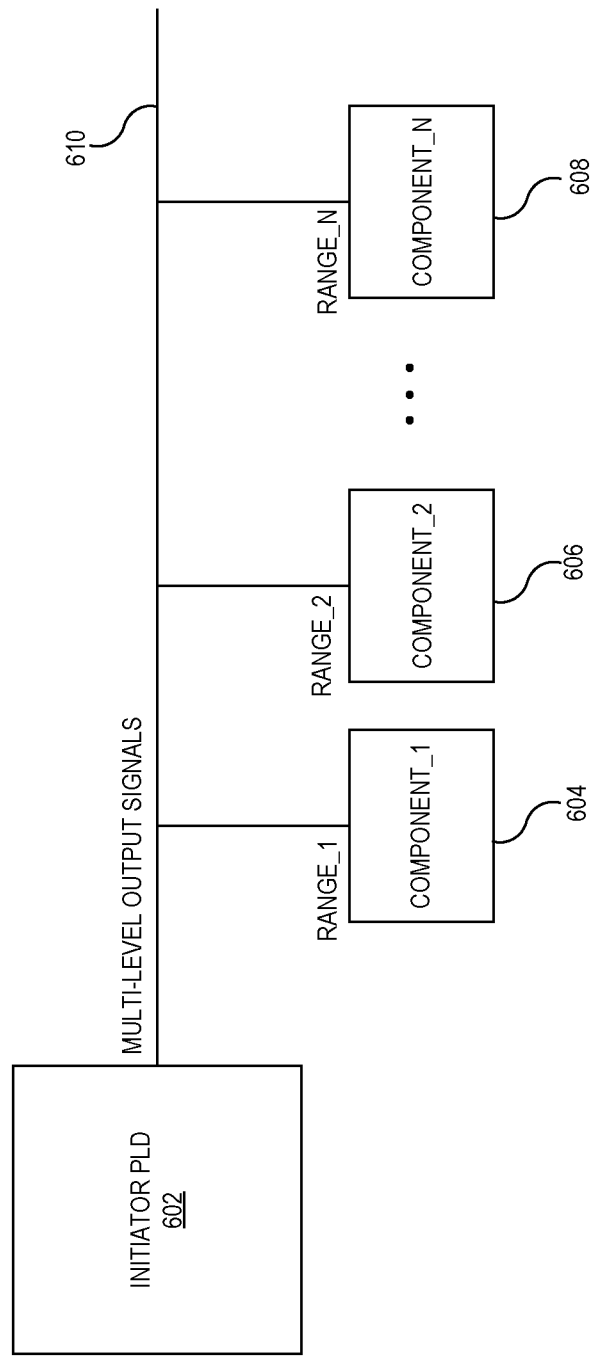
FIG. 6 illustrates an application example of PLDs implementing multi-level signaling, according to one aspect of the instant application.

FIG. 6 illustrates an application example of PLDs implementing multi-level signaling, according to one aspect of the instant application. In this example, an initiator PLD 602 can send multi-level output signals to a number of components, including components 604, 606, and 608, via bus 610. Each component can have its receiver configured to detect input signals within a particular range, and the receiver will not respond to signals outside of its detectable range. Initiator PLD 602 can adjust the voltage level of its output signals in order to send signals to a particular component. For example, to send signals to component 604, initiator PLD 602 can configure the control logic in its output circuit (e.g., control logic 304 shown in FIG. 3A) such that the voltage range of its output is within range_1. The input circuit (e.g., input circuit 400 shown in FIG. 4) in component 604 can correctly detect and recognize that the signal is intended for component 604. On the other hand, the input circuit in other components (e.g., components 606 and 608) will not respond to and will ignore signals within range_1.

A similar principle can be used in secure transactions between PLDs. In conventional approaches, to authenticate hardware components from being compromised for the purpose of receiving sensitive information, specially designed crypto software components and/or expensive firmware need to be implemented to detect malware. Such solutions can be cumbersome and expensive. The multi-level signaling implemented in PLDs can enhance transaction security at a much lower cost. More specifically, an initiator PLD can authenticate and validate a logic section in a target device by sending commands (e.g., via a secure channel) to the target device to program the control logic in its output circuit according to a predetermined sequence of voltage levels, which can cause the target device to send a specific pulse train with multiple discrete voltage levels (e.g., the pulse train shown in FIG. 3B) to the initiator PLD. The initiator PLD can configure its input circuit to receive this specific pulse train in order to authenticate the target device. The initiator PLD can dynamically vary the voltage-level sequence to further enhance security.

Figure 7:
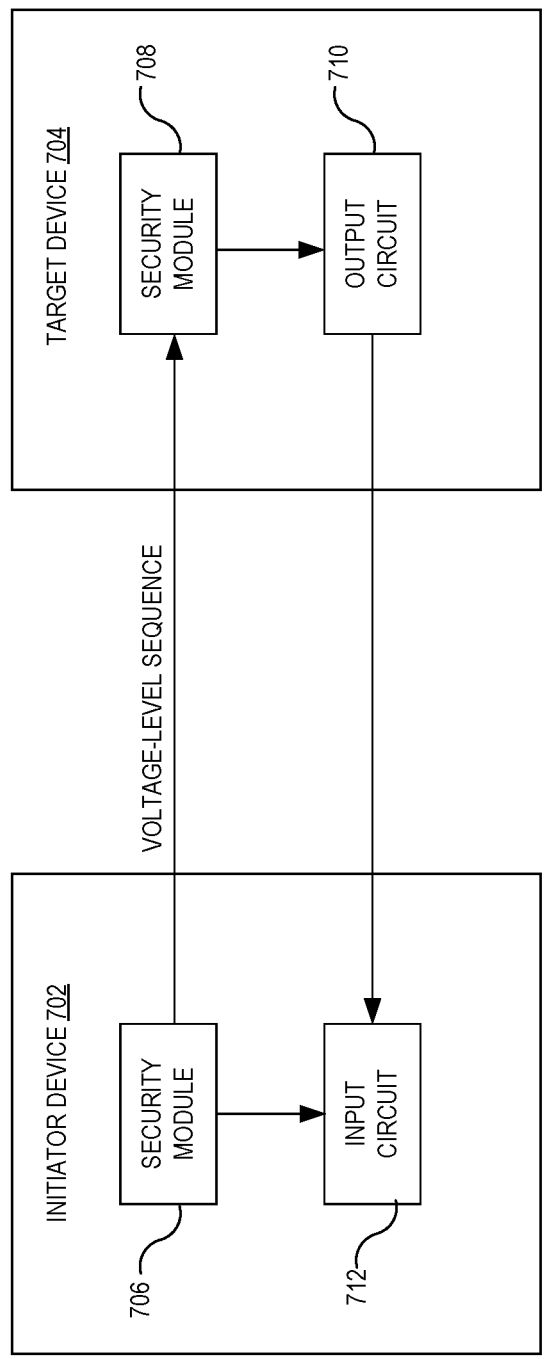
FIG. 7 illustrates an application example of PLDs implementing multi-level signaling, according to one aspect of the instant application.

FIG. 7 illustrates an application example of PLDs implementing multi-level signaling, according to one aspect of the instant application. In FIG. 7, an initiator device 702 and a target device 704 need to perform secure transactions. Each device can include a security module. Initiator device 702 can include a security module 706, and target device 704 can include a security module 708. During operation, security module 706 of initiator device 702 can send a voltage-level sequence to security module 708 of target device 704. Using the voltage levels shown in FIG. 3B as an example, the voltage-level sequence can include voltages selected from $V_1$ to $V_7$. An example of the sequence can be $V_1 V_2 V_7 V_5 \ldots$ . According to one aspect, the voltage-level sequence can be sent from initiator device 702 to target device 704 via a separate secure channel. According to an alternative aspect, the voltage-level sequence may be previously stored in each security module.

Security module 708 of target device 704 can program output circuit 710 of target device 704 using the voltage-level sequence. More specifically, security module 708 can program the control logic in output circuit 710 in such a way that output circuit 710 can output a multi-level pulse train based on the voltage-level sequence. At the same time, security module 706 of initiator device 702 can program input circuit 712 of initiator device 702 based on the voltage-level sequence. More specifically, security module 706 can program the control logic in input circuit 712 in a way such that input circuit 712 can correctly detect the multi-level pulse train, meaning that for each pulse, input circuit 712 can be tuned to a particular voltage range corresponding to that pulse. Note that another device without the knowledge of the voltage-level sequence will not be able to conduct secure transactions with initiator device 702, because input circuit 712 will not be tuned to the output voltage ranges of the other device.

According to further aspects, the voltage-level sequence can vary in time. Security module 708 of target device 704 can configure output circuit 710 to output multi-level signals of different voltage ranges in different durations. For example, in duration $T_1$, output circuit 710 can output signals within a voltage range $V_1$; in duration $T_2$, output circuit 710 can output signals within a voltage range $V_2$; and so on. The durations (e.g., $T_1$ and $T_2$) and the voltage ranges (e.g., $V_1$ and $V_2$) can be programmable. With the knowledge of the durations and voltage ranges, security module 706 of initiator device 702 can configure input circuit 712 to correctly receive the multi-level signals at each duration. For example, during $T_1$, input circuit 712 can be configured to detect signals within voltage range $V_1$; during $T_2$, input circuit 712 can be configured to detect signals within voltage range $V_2$; and so on. Note that devices without the knowledge of the durations and voltage ranges will not be able to correctly receive the multi-level signals.

Compared to conventional security approaches based on binary logic, using multi-level signals to facilitate secure transactions between PLDs can be more resilient and require only hardware configuration on the participating devices (including the initiator and the target). The time resolution (i.e., durations) and the voltage resolution depend on the hardware complexity implemented on the participating devices. For example, a higher voltage resolution requires that the DAC module (e.g., R-2R resistor ladder network 306 shown in FIG. 3A) has a more complex structure. This hardware-based solution can be cheaper than developing complex software- or firmware-based solutions.

The ability to detect multi-level signals can also allow the PLD to interface with microcontrollers capable of sending analog signals (e.g., a microcontroller with embedded DACs). Conventional PLDs cannot provide such analog interfaces.

A large-scale PLD can typically include multiple banks, with each bank powered by a particular power rail. Different banks can be powered by power rails providing different voltages. In conventional PLDs, a particular bank can send and receive signals with a voltage level linked to the power rail. For example, a PLD bank powered by a voltage $V_i$ would be able to detect a binary signal having two voltage levels, 0 and $V_i$. The conventional PLD bank cannot detect a signal with multiple different voltage levels between 0 and $V_i$. However, by implementing the multi-level circuits at its input and/or output (e.g., input circuit 300 and output circuit 200), a PLD bank is able to detect and/or output multi-level signals.

Figure 8:
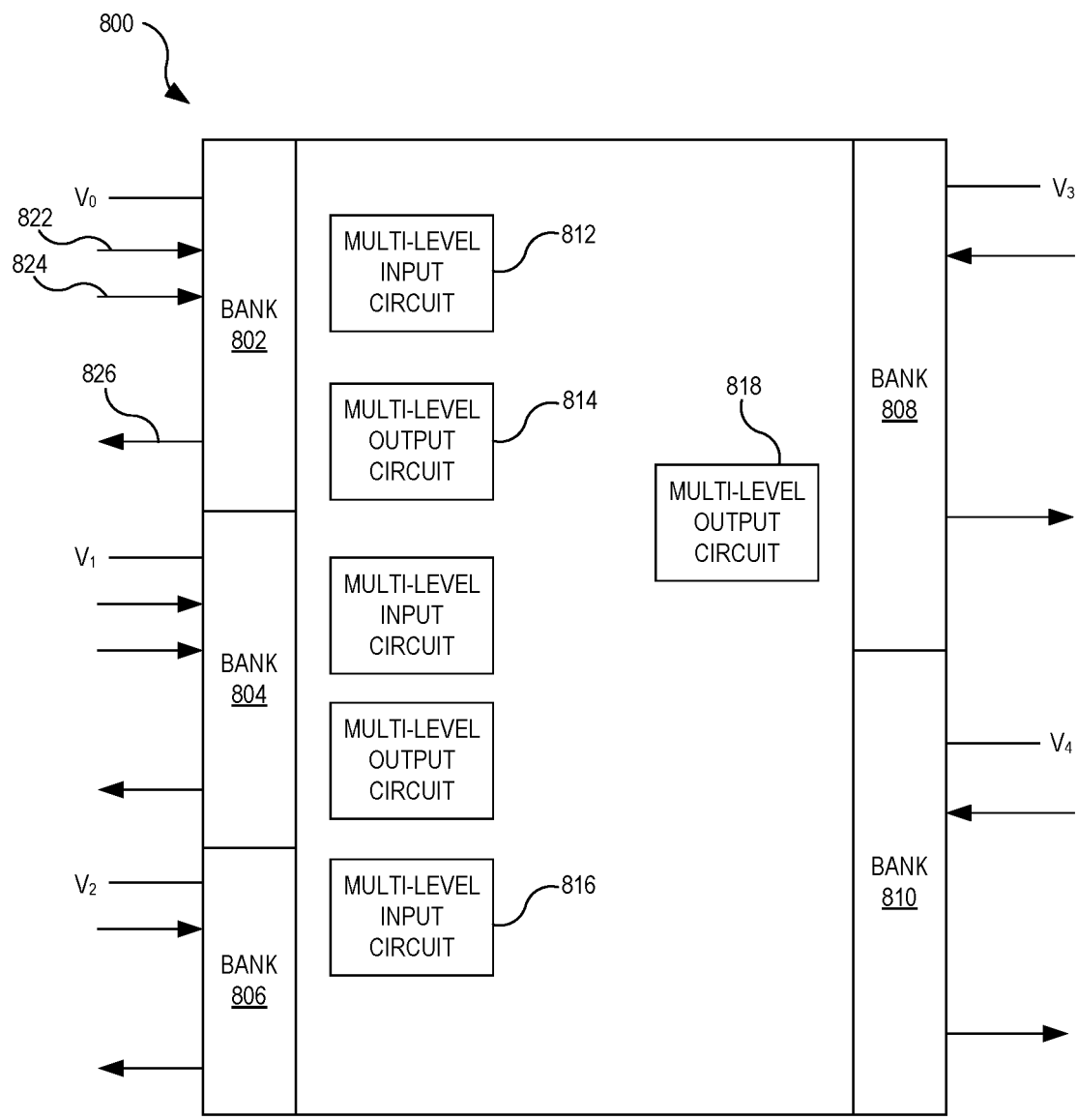
FIG. 8 illustrates an example of a PLD, according to one aspect of the instant application.

FIG. 8 illustrates an example of a PLD, according to one aspect of the instant application. PLD 800 can include a plurality of banks, banks 802-810. Each power bank can be powered by a power rail at a particular voltage level. For example, banks 802-810 can be respectively powered at voltages $V_0$-$V_4$. Each bank can include a number of inputs and outputs. For example, bank 802 can include inputs 822 and 824 and output 816.

In the example shown in FIG. 8, PLD bank 802 can include a multi-level input circuit 812 and a multi-level output circuit 814. Multi-level input circuit 812 can include one or more circuit components, with each circuit component being similar to input circuit 400 shown in FIG. 4. According to one aspect, inputs 822 and 824 can each be coupled to a circuit component within multi-level input circuit 812 such that multi-level signals arriving at each input can be detected. According to an alternative aspect, only input 822 is coupled to multi-level input circuit 812, whereas input 824 is coupled to a conventional binary input buffer (not shown in FIG. 8).

Output 826 can be coupled to multi-level output circuit 814, which can be similar to output circuit 200 shown in FIG. 2 or output circuit 300 shown in FIG. 3A. Accordingly, output 826 can output multi-level signals. The resolution (or the steps between possible voltage levels) of the multi-level signals generated at output 826 can depend on the number of bits of the DAC implemented by multi-level output circuit 814. A higher resolution requires a more complex DAC. Note that the possible voltage levels can be determined by a reference voltage (which can be the voltage provided by the power rail) and the number of bits of the DAC. In the example shown in FIG. 8, bank 802 includes one output. It is also possible that bank 802 includes multiple outputs, with all or a subset of the multiple outputs coupled to multi-level output circuit 814.

In FIG. 8, PLD bank 804 also includes a multi-level input circuit and a multi-level output circuit, meaning that it can receive and transmit multi-level signals. PLD bank 806 only includes a multi-level input circuit 816, meaning that it can receive multi-level signals but can only transmit binary signals. PLD bank 808 only includes a multi-level output circuit 818, meaning that it can transmit multi-level signals but can only receive binary signals. PLD bank 810 can only receive and transmit binary signals. There can be many more different combinations between the PLD banks and the multi-level input/output circuits than what is shown in FIG. 8.

In general, the proposed solution allows a PLD to implement multi-level signaling logic that is superior to binary logic, because the multi-level signaling involves variable amplitude-modulated transactions. More specifically, a multi-level output signal can be generated by modifying the output buffer circuit to include a control logic, a simple DAC, and a unity gain opamp. At the receiver, similar circuit components (e.g., simple DACs and opamps) can be used to generate variable inputs at comparators to allow the receiver to detect multi-level signals within different ranges. Because the comparators and opamps are common components implemented in PLDs and the simple DAC can be implemented using an R-2R resistor ladder network, the additional cost associated with the multi-level signaling logic can be kept low. The multi-level signaling in PLDs can have many applications, including but not limited to reducing the number of pins on the PLDs, allowing for a single signal to perform multiple functions (i.e., being sent to multiple destinations without the need for address decoding), and facilitating secure transactions (by dynamically modulating the voltage range of a transmitted signal).

One aspect of the instant application can provide a programmable logic device. The device can include an input circuit for detecting a multi-level input signal and an output circuit. The input circuit can include an input pin for receiving the multi-level input signal; first and second programmable voltage generator to generate, respectively, first and second multi-level voltage signals; a pair of comparators, each comparator having a first input coupled to the input pin and a second input coupled to a corresponding programmable voltage generator; and a logic gate coupled to the comparators, thereby facilitating the detection of the multi-level input signal based on outputs of the comparators. The output circuit can include a third programmable voltage generator to generate a third multi-level voltage signal, an output pin, and a voltage buffer coupling the third programmable voltage generator to the output pin, thereby facilitating the programmable logic device to output, over the output pin, the third multi-level voltage signal.

In a variation on this aspect, each programmable voltage generator can include a control logic to output a binary bit sequence and a digital-to-analog converter (DAC) to convert the binary bit sequence to a corresponding multi-level voltage signal.

In a further variation, the control logic is to output a time-varying bit sequence.

In a further variation, the DAC comprises an R-2R resistor ladder network.

In a variation on this aspect, each comparator can include a differential amplifier.

In a further variation, the first multi-level voltage signal can be lower than the second multi-level voltage signal, the first multi-level voltage signal can be sent to a positive input of the differential amplifier of one comparator, and the second multi-level voltage signal can be sent to a negative input of the differential amplifier of the other comparator.

In a further variation, the logic gate can be an AND gate.

In a further variation, the logic gate is to output a logic "1" in response to detecting that the multi-level input signal is in a range between the first and second multi-level voltage signals.

In a variation on this aspect, the voltage buffer can include a unity gain operational amplifier.

One aspect of the instant application can provide a circuit for detecting a multi-level input signal received at a programmable logic device. The circuit can include an input pin for receiving the multi-level input signal; first and second programmable voltage generator to generate, respectively, first and second multi-level voltage signals; a pair of comparators, with each comparator having a first input coupled to the input pin and a second input coupled to a corresponding programmable voltage generator; and a logic gate coupled to the comparators, thereby facilitating the detection of the multi-level input signal based on outputs of the comparators.

One aspect of the application can provide an output circuit of a programmable logic device. The circuit can include a programmable voltage generator to generate a multi-level voltage signal, an output pin, and a voltage buffer coupling the programmable voltage generator to the output pin, thereby facilitating the programmable logic device to output, over the output pin, the multi-level voltage signal.

The above description is presented to enable any person skilled in the art to make and use the examples and is provided in the context of a particular application and its requirements. Various modifications to the disclosed examples will be readily apparent to those skilled in the art, and the general principles defined herein may be applied to other implementations and applications without departing from the spirit and scope of the present disclosure. Thus, the scope of the present disclosure is not limited to the examples shown but is to be accorded the widest scope consistent with the principles and features disclosed herein.

The foregoing descriptions of examples have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A programmable logic device, comprising:
   an input circuit for detecting a multi-level input signal, wherein the input circuit comprises:
      an input pin for receiving the multi-level input signal;
      first and second programmable voltage generators to generate, respectively, first and second multi-level voltage signals;
      a pair of comparators, wherein each comparator has a first input coupled to the input pin and a second input coupled to a corresponding programmable voltage generator; and
      a logic gate coupled to the comparators, thereby facilitating the detection of the multi-level input signal based on outputs of the comparators; and
   an output circuit comprising:
      a third programmable voltage generator to generate a third multi-level voltage signal;
      an output pin; and
      a voltage buffer coupling the third programmable voltage generator to the output pin, thereby facilitating the programmable logic device to output, over the output pin, the third multi-level voltage signal.

2. The programmable logic device of claim 1, wherein each programmable voltage generator comprises a control logic to output a binary bit sequence and a digital-to-analog converter (DAC) to convert the binary bit sequence to a corresponding multi-level voltage signal.

3. The programmable logic device of claim 2, wherein the control logic is to output a time-varying binary bit sequence.

4. The programmable logic device of claim 2, wherein the DAC comprises an R-2R resistor ladder network.

5. The programmable logic device of claim 1, wherein each comparator comprises a differential amplifier.

6. The programmable logic device of claim 5, wherein the first multi-level voltage signal is lower than the second multi-level voltage signal, wherein the first multi-level voltage signal is sent to a positive input of the differential amplifier of one comparator, and wherein the second multi-level voltage signal is sent to a negative input of the differential amplifier of the other comparator.

7. The programmable logic device of claim 6, wherein the logic gate is an AND gate.

8. The programmable logic device of claim 7, wherein the logic gate is to output a logic "1" in response to detecting that the multi-level input signal is in a range between the first and second multi-level voltage signals.

9. The programmable logic device of claim 1, wherein the voltage buffer comprises a unity gain operational amplifier.

10. A circuit for detecting a multi-level input signal received at a programmable logic device, the circuit comprising:
    an input pin for receiving the multi-level input signal;
    first and second programmable voltage generators to generate, respectively, first and second multi-level voltage signals;
    a pair of comparators, wherein each comparator has a first input coupled to the input pin and a second input coupled to a corresponding programmable voltage generator; and
    a logic gate coupled to the comparators, thereby facilitating the detection of the multi-level input signal based on outputs of the comparators.

11. The circuit of claim 10, wherein each programmable voltage generator comprises a control logic to output a binary bit sequence and a digital-to-analog converter (DAC) to convert the binary bit sequence to a corresponding multi-level voltage signal.

12. The circuit of claim 11, wherein the control logic is to output a time-varying bit sequence.

13. The circuit of claim 11, wherein the DAC comprises an R-2R resistor ladder network.

14. The circuit of claim 10, wherein each comparator comprises a differential amplifier.

15. The circuit of claim 14, wherein the first multi-level voltage signal is lower than the second multi-level voltage signal, wherein the first multi-level voltage signal is sent to a positive input of the differential amplifier of one comparator, and wherein the second multi-level voltage signal is sent to a negative input of the differential amplifier of the other comparator.

16. The circuit of claim 15, wherein the logic gate is an AND gate.

17. The circuit of claim 16, wherein the logic gate is to output a logic "1" in response to detecting that the multi-level input signal is in a range between the first and second multi-level voltage signals.

18. An output circuit of a programmable logic device, the circuit comprising:
- a programmable voltage generator to generate a multi-level voltage signal;
- an output pin; and
- a voltage buffer coupling the programmable voltage generator to the output pin, thereby facilitating the programmable logic device to output, over the output pin, the multi-level voltage signal, wherein the programmable voltage generator comprises a control logic to output a binary bit sequence and a digital-to-analog converter (DAC) to convert the binary bit sequence to a corresponding multi-level voltage signal, and wherein the DAC comprises an R-2R resistor ladder network.

19. The output circuit of claim 18, wherein the voltage buffer comprises a unity gain operational amplifier.

* * * * *